United States Patent [19]

Knauer et al.

[11] 4,233,578
[45] Nov. 11, 1980

[54] TRANSVERSAL FILTER

[75] Inventors: Karl Knauer, Kirchseeon; Hans-Jörg Pfleiderer, Zorneding, both of Fed. Rep. of Germany

[73] Assignee: Siemens Aktiengesellschaft, Berlin & Munich, Fed. Rep. of Germany

[21] Appl. No.: 19,780

[22] Filed: Mar. 12, 1979

[30] Foreign Application Priority Data

Mar. 31, 1978 [DE] Fed. Rep. of Germany ....... 2813971
Mar. 31, 1978 [DE] Fed. Rep. of Germany ....... 2813972
Mar. 31, 1978 [DE] Fed. Rep. of Germany ....... 2813997
Mar. 31, 1978 [DE] Fed. Rep. of Germany ....... 2813998

[51] Int. Cl.$^2$ .................. H03H 7/28; H03K 5/156; G11C 19/28
[52] U.S. Cl. .................. 333/165; 307/221 D; 333/166; 357/24
[58] Field of Search .................. 333/165, 166, 173; 307/221 R, 221 C, 221 D; 357/24; 328/167; 364/824–827

[56] References Cited

U.S. PATENT DOCUMENTS

| 4,056,737 | 11/1977 | Sequin ........................... 333/165 X |
| 4,080,581 | 3/1978 | Sakaue et al. ................ 307/221 D X |
| 4,163,957 | 8/1979 | Knauer et al. ............... 307/221 D X |

FOREIGN PATENT DOCUMENTS

2643704 3/1978 Fed. Rep. of Germany.
2644284 4/1978 Fed. Rep. of Germany.

OTHER PUBLICATIONS

Knauer et al.–"Parallel-In/Serial-Out: A New Approach for Transversal Filters", Electronics Letters, vol. 13, No. 5, Mar. 3, 1977, pp. 126–127.
Sequin et al., "Charge Transfer Devices", Academic Press, Inc. New York, San Francisco, London, 1975, pp. 1–18, 48–50.
Sakaue et al.–"An Input-Weighted CCD Transversal Filter", Japanese Journal of Applied Physics, vol. 16 (1977) Supplement 16-1, pp. 391–396, 387–390.

Primary Examiner—Marvin L. Nussbaum
Attorney, Agent, or Firm—Hill, Van Santen, Steadman, Chiara & Simpson

[57] ABSTRACT

A transversal filter utilizes a charge transfer device (CTD) shift register having parallel inputs and evaluation circuits assigned to those inputs. The evaluation circuits which form evaluation coefficients by reading-in signal-dependent amounts of charges. The charges are summed in the shift register and the charges successively reaching the output level are read out in series in order to form the filtered output signal. An electric coefficient setting is provided which guarantees a large relative adjustment range having a small requirement for semiconductor surface. The evaluation circuits have separately actuated source zones or additional source zones which are arranged in pairs on opposite sides of the CTD transfer channel, or which are provided with gate oxide and field oxide areas arranged beneath a transfer gate between the evaluation circuits and the shift register. A transversal filter constructed according to the invention is suitable for use as an electrically programmable frequency filter.

8 Claims, 10 Drawing Figures

TRANSVERSAL FILTER

BACKGROUND OF THE INVENTION

1. Field of the Invention

The present invention relates to a transversal filter in which the stages of an analog charge transfer device (CTD) shift register integrated on a doped semiconductor substrate is provided with parallel inputs and evaluation circuits assigned thereto, and more particularly to such a filter in which the evaluation circuits each exhibit an area which is doped opposite to the substrate, first and second input gates and a transfer gate, the transfer gate being arranged directly adjacent to the transfer channel of the CTD shift register, and in which the one input gate is connected to an input signal, the other input gate is connected to a constant DC voltage, the oppositely doped area is connected to a first pulse voltage and the transfer gate is connected to a second pulse voltage, and in which the output signal can be tapped from an output of the CTD shift register.

2. Description of the Prior Art

A transversal filter of the type generally set forth above is disclosed in the publication "Electronics Letters", Vol. 13, No. 5, Mar. 3, 1977, pp. 126-127. The magnitude of the individual coefficients with which the input signal is individually evaluated at each parallel input is thereby provided by the capacitance of the second input gate. Transversal filters of this type are also the subject of the German patent application No. P 26 43 704.7. A disadvantage arises, however, in that large amounts of the evaluation coefficients correspondingly enlarge the semiconductor surface to be provided for the transversal filter.

From the "Proceedings of the 8th Conference (1976 International) on Solid State Devices, Tokyo, 1976", and printed in the "Japanese Journal of Applied Physics", Vol. 16 (1977) Supplement 16-1, pp. 387-390, such a transversal filter is known in which a charge coupled device (CCD) shift register has several transfer channels insulated from one another by separating diffusions, the channels being respectively individually assigned to the parallel inputs. The transfer gate thereby provided respectively consists of the first displacement electrode of the respective transfer channel in the evaluation circuits. The transfer channels are conveyed together in a common output level in whose range the separating diffusions mentioned above are omitted. Then, a summation of the signal portions occurs to provide an output signal, the signal portions being separately transmitted by way of the channels and arriving with different delays. The evaluation coefficients with which the signal fed to the parallel outputs is occupied, are provided by the gate surfaces in the individual evaluation circuits. A disadvantage also arises with this construction, however, in that the necessary semiconductor surface greatly increases with the number of parallel inputs and the desired amounts of evaluation coefficients.

From the above-mentioned "Proceedings", printed in the "Japanese Journal of Applied Physics", Vol. 16 (1977), Supplement 16-1, pp. 391-396, an additional transversal filter is known which differs from the type initially mentioned by a different design of the evaluation circuits and the parallel inputs. In this structure each of the individual evaluation circuits contains metal-oxide-semiconductor (MOS) field effect transistors connected in series, and a resistance diffusion, whereas each parallel input includes a level of a four-phase CCD shift register provided with an input diffusion. The input diffusion is connected to a terminal of the resistor and the last displacement electrode is arranged adjacent to a displacement electrode of a CCD shift register which undertakes the summation of the signal portions. The gate of one of the MOS field effect transistors of each evaluation circuit is connected to the input signal, the gate of the other MOS field effect transistor is respectively connected to a DC voltage which determines, by its magnitude, the current flowing through the transistors, and thereby determines the respective evaluation coefficient. Thereby, the transmitting properties of the transversal filter can be electrically adjusted. However, the disadvantage with this structure is that only in a small alteration range is the current linearly dependent on the DC voltage.

In the earlier German patent application No. P 26 44 284.2 it has already been suggested to form charge amounts twice in succession in order to realize an evaluation coefficient in the individual evaluation circuits and to input the amounts of charge into the respective stages of the CTD shift register in order to design the evaluation (input weighting) circuits in a space-saving manner.

SUMMARY OF THE INVENTION

The present invention has the underlying object of providing a transversal filter of the type generally mentioned above which is designed on the smallest possible surface of a semiconductor substrate and which nevertheless permits an electrical adjustment of the evaluation coefficient within a great relative adjustment range.

The above object is achieved in a transversal filter of the type generally mentioned above in one embodiment in which the zones of the evaluation circuits which are doped in opposition to the semiconductor substrate are respectively separated from one another and are provided with connections to pulse voltages which are individually assigned to the evaluation circuits, and in that the pulse repetition rates of the first pulse voltages are higher than the pulse repetition rate of a transfer pulse voltage of the CTD shift register and are selected such that they respectively determine the magnitude of the individual evaluation coefficients.

In a second embodiment one or more evaluation circuits are provided with additional zones which are doped opposite to the substrate, the additional zones being connected to an additional first pulse voltage which is phase-displaced vis-a-vis a first pulse voltage which is fed to the remaining zones of the evaluation circuits, the remaining zones being also doped in opposition to the substrate. In a third exemplary embodiment of the invention an evaluation circuit is supplemented by an additional evaluation circuit arranged on the opposite side of the transfer channel in order to form a working pair of evaluation circuits. The oppositely doped zones, the input gate electrodes and the transfer gate electrodes of the two evaluation circuits are respectively connected to common terminals for receiving a first pulse voltage, for receiving the input signal, for receiving the constant DC voltage and for receiving a second pulse voltage.

In a fourth exemplary embodiment of the invention, a thin layer area of the insulating layer covering the surface of the semiconductor substrate is provided beneath the transfer gate electrodes of the individual evaluation circuits, respectively, in the area of a prescribed number of transfer electrodes of the respective stages of the shift register, whereas in the area of the remaining transfer electrodes of the respective stages thick layer areas of the insulating layer are provided beneath the transfer gate electrode. The number of the thin layer areas beneath the transfer gate electrodes of the individual evaluation circuits also determines the numbers of the evaluation coefficients formed in the evaluation circuits.

The additional advantage obtained with the first examplary embodiment of the invention is, in particular, that different pulse repetition frequencies are readily and space-savingly determined by the actuation of the evaluation circuits with the aid of pulse voltages, and how often the amounts of charge provided by the surfaces of the evaluation circuits are input into the respective stages of the CTD shift register from the individual evaluation circuits, whereby the evaluation coefficients assigned to the evaluation circuits result from the number of the respectively input amounts of charge. As the inputting of the amounts of charge can proceed with a considerably higher frequency than the pulsing of the CTD shift register, it is possible to provide large relative adjustment ranges for the evaluation coefficients which, for example, include relative sizes of 1:1000 or more. Between the magnitude controlling the adjustment of an evaluation coefficient, i.e. of the pulse repetition frequency of the pulse voltage fed to the evaluation circuit, and the adjusted evaluation coefficient, there exists a linear dependency. The adjustability of the evaluation coefficients provided within wide limits facilitates a very versatile utilization of such a transversal filter.

The advantage obtained with the second exemplary embodiment of the invention is, in particular, that individual or several evaluation coefficients can be greatly accentuated as to their numbers with a minimum of surface expense by means of the actuation of the additional, oppositely doped zones of individual or of several evaluation circuits with the aid of an additional pulse voltage.

The particular advantage obtained with the third exemplary embodiment of the invention is, in particular, that by means of the division of the surface of the second input gate required for a specific evaluation coefficient for the input gate electrodes of two evaluation circuits corresponding with one another and arranged on different sides of the CTD transfer channel and lying opposite one another at the same stage of the shift register, the lengths of these two electrodes are only half as great as the length of the second input gate of the single evaluation circuit which supplies the same evaluation coefficient. Thereby, the time for the read-in of an amount of charge determining the evaluation coefficient which is required for two evaluation circuits lying opposite one another corresponds with one-fourth of the time required for reading-in of the same amount of charge by way of a single evaluation circuit. Therefore, a transversal filter constructed in accordance with the principles of the present invention, particularly the third exemplary embodiment thereof, may be used at higher operating frequencies than heretofore known for conventional transversal filters.

The advantage obtained with the fourth exemplary embodiment of the invention is that by the design of the thick-layer and thin-layer areas of the insulating layer beneath the transfer gate electrodes of the evaluation circuits it is determined, in a simple and space-saving manner, how often amounts of charge provided by the surfaces of the evaluation circuits are input into the respective stages of the CCD shift register from the individual evaluation circuits, whereby the evaluation coefficients assigned to the evaluation circuits result from the number of the respectively input amounts of charge. This results in the possibility of providing the transversal filter with considerably differing evaluation coefficients in a simple manner.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
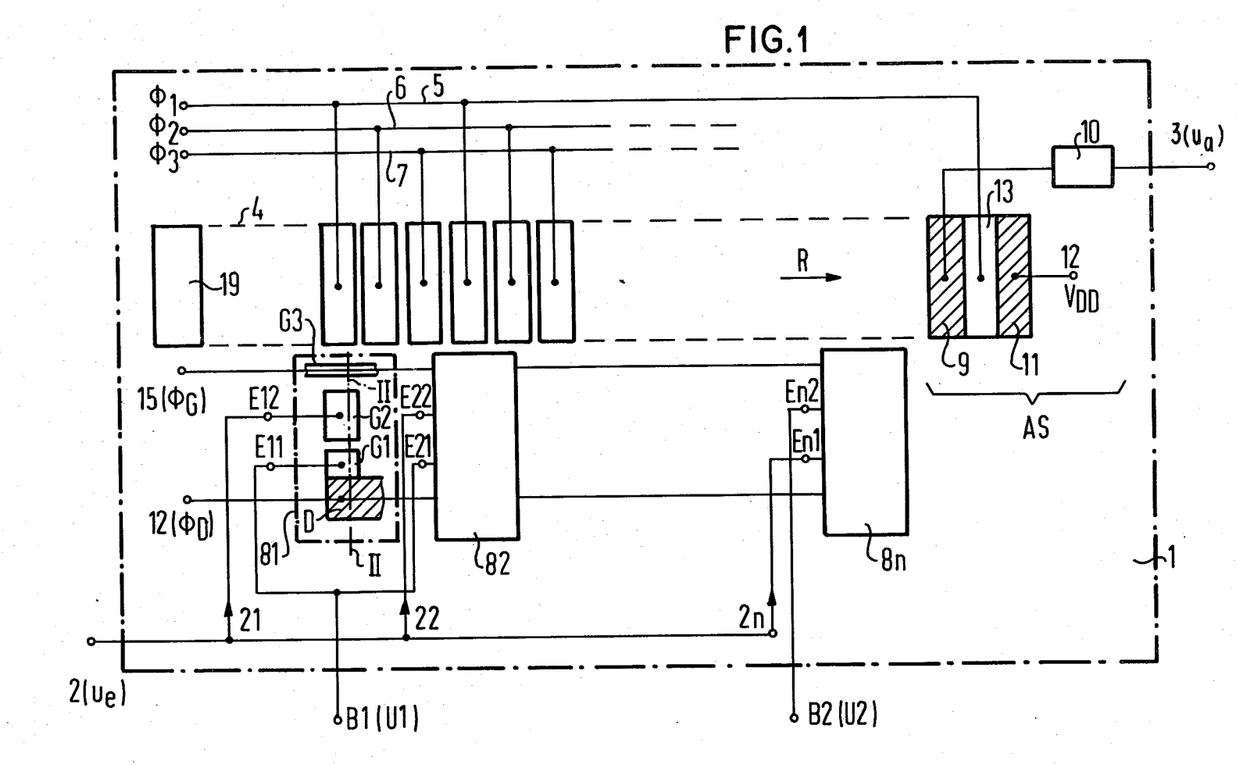
FIG. 1 is a schematic representation illustrating, in principle, a known transversal filter having a CCD shift register with parallel inputs and one series output.

Referring to FIG. 1, a transversal filter is illustrated which is designed as a semiconductor circuit monolithically integrated on a doped semiconductor substrate 1, for example, a p-conducting silicon substrate. An analog input signal $u_e$ is fed to a terminal 2, whereas an analog output signal $u_a$ can be tapped at an output 3, the output signal having a chronological form which corresponds with that of the signal $u_e$ after it has passed through a frequency filter having a specific frequency characteristic. The frequency characteristic, for example, can be that of a low-pass filter. A shift register 4 is designed as a charge coupled device and operates in three-phase operation. The arrangement has a number of electrodes 411, 412, 413, 421, 422, 423, etc. which are located in the displacement direction R closely adjacent and extending over a thin insulating layer, for example, of a gate oxide layer consisting of $SiO_2$ which covers the substrate 1.

Groups of three adjacent electrodes, for example the electrodes 411, 412, 413, or 421, 422 and 423, belong to a shift register stage, whereby the first electrodes 411, 421 etc. of all stages are connected to a line 5 for receiving a transfer pulse $\phi_1$, the second electrodes 412, 422 etc. are connected to a common line 6 for receiving a shift pulse voltage $\phi_2$, and the third electrodes 413, 423 etc. are connected to a line 7 for receiving a shift pulse voltage $\phi_3$. For a chronological course of the voltages $\phi_1$–$\phi_3$ in accordance with FIG. 3, local maxima of the surface potential $\phi_s$ result in the semiconductor substrate beneath each third electrode, so-called potential wells result which are displaced in the pulse of the voltages $\phi_1$–$\phi_3$ stepwise from stage-to-stage in the direction R. If no electric charges are injected in these potential wells, respectively surrounded by space charge zones, the charges which exhibit a polarity corresponding with one of the minority charge carriers of the substrate 1, the carriers are then displaced with the potential wells and can be read in a time-delayed manner from the output stage AS of the shift register 4 after passing the total shift register 4. In the embodiment of a shift register 4 illustrated in FIG. 1, the output stage AS contains a diffusion zone 9 which is switched free at times from external potentials (floating diffusion output). The diffusion zone 9 is electrically connected to the output 3 by way of an output amplifier 10. The zone 9 represents a field effect transistor together with a second diffusion zone 11 which is connected to a drain voltage $V_{DD}$ by way of a terminal 12 and a gate electrode 13 which is connected to the shift pulse voltage $\phi_1$ by way of the line 5, the field effect transistor intermittently placing the zone 9 at a reference potential when the individual voltage pulses $\phi_1$ occur.

The input 2 of the transversal filter is connected to a number of parallel inputs 21, 22, 2n which are respectively assigned to individual stages of the shift register 4. Each of these parallel inputs is provided with an evaluation circuit 81, 82 8n. The parallel inputs each exhibit a zone D which is doped opposite to the doping of the substate, a first input gate G1, a second input gate G2 and a transfer gate G3, whereby the zones D of all evaluation circuits 81–8n are cohesively designed and connected to a terminal 14 (FIG. 2), whereas the transfer gate electrodes G3 of all evaluation circuits are also cohesively designed and are provided with a terminal 15. The first input gate G1 of the evaluation circuit 81 is provided with a terminal E11, and the second input gate G2 is provided with a terminal E12. The respective terminals of the evaluation circuit 82 are referenced E21 and E22, while the respective terminals of the evaluation circuit 8n are referenced En1 and En2. The terminals E12, E22 and En1 are respectively connected to the parallel inputs 21, 22 and 2n, whereas the terminals E11 and E21 are connected to a common terminal B1 and the terminal En2 is connected to a terminal B2.

Figure 2:
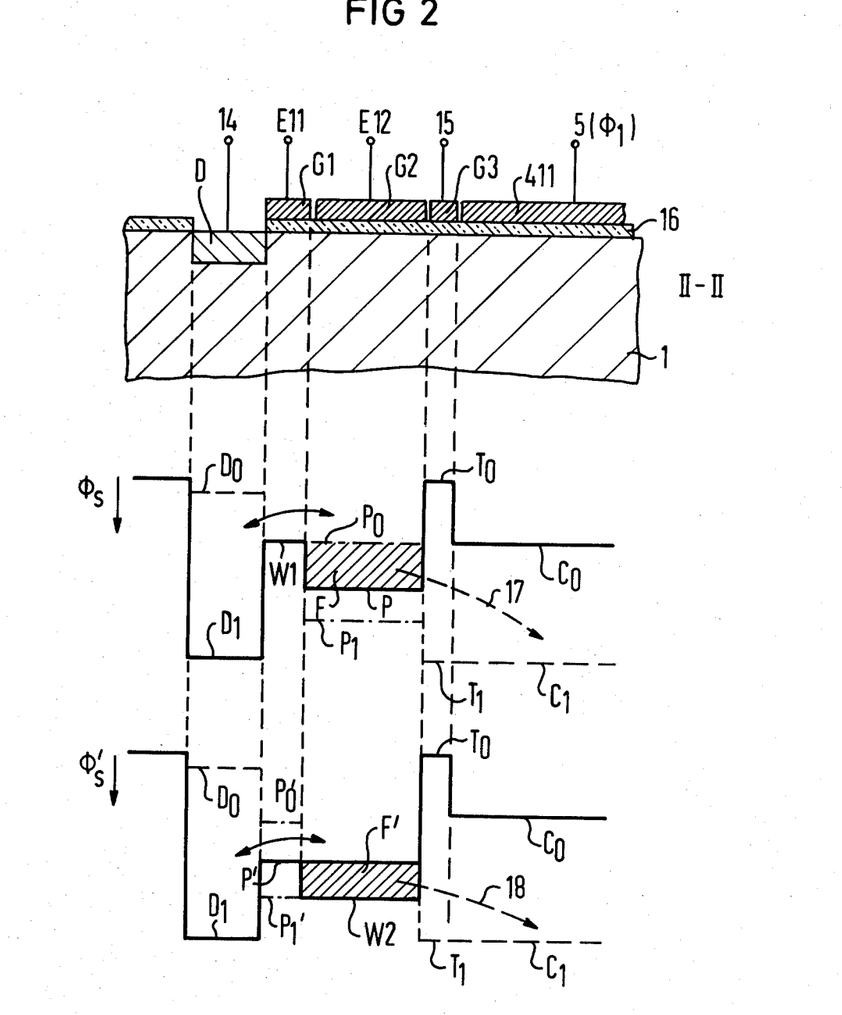
FIG. 2 is a cross-sectional view taken through a portion of the circuit of FIG. 1, and corresponding charge transfer diagrams.

FIG. 2 illustrates the input weighting or evaluation circuit 81 in a sectional view taken along the line II—II of FIG. 1. The portions already illustrated in FIG. 1 have been provided with the same reference characters in FIG. 2. The thin insulating layer on which the portions G1, G2, G3 and 411 are located is referenced 16. The evaluation circuit 81 is designed for a positive evaluation coefficient. A constant DC voltage U1 is applied to the terminal E11 of the first input gate G1 by way of the terminal B1 (FIG. 1), the DC voltage being less than the smallest input signal $u_e$ to be evaluated, so that a fixed potential well W1 results for the surface potential $\phi_s$ beneath the gate electrode G1. The input signal $u_e$ is fed to the terinal E12 by way of a parallel input 21, whereby potential values between $P_1$ for the maximum signal $u_e$) and $P_0$ (for the minimum signal $u_e$) result under the gate electrode G2.

Figure 3:
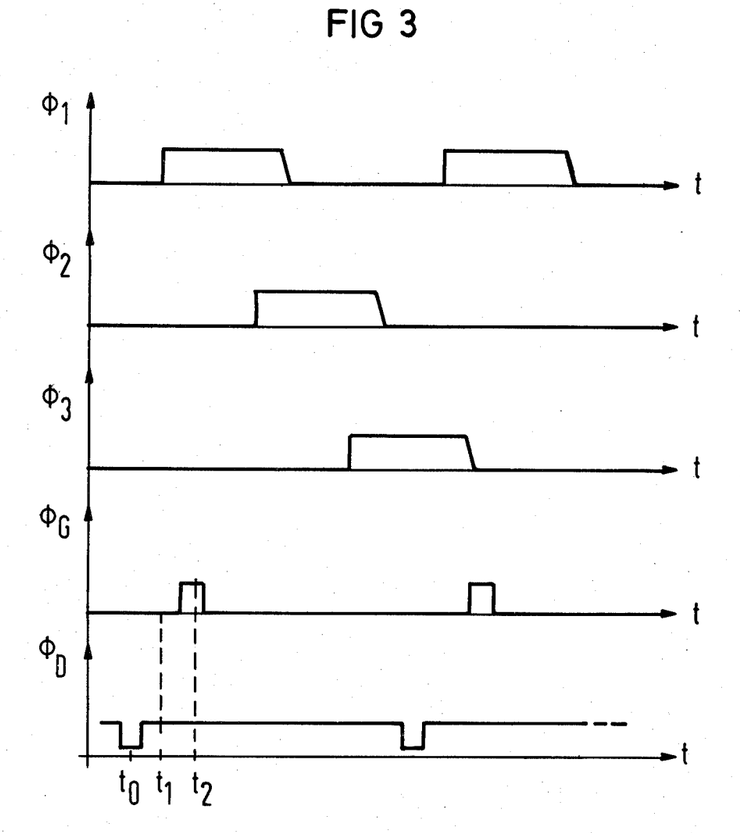
FIG. 3 is a pulse diagram of the operating voltages necessary for the transversal filter illustrated in FIGS. 1 and 2.

Under the influence of the pulse voltages $\phi_G$ and $\phi_D$ illustrated in FIG. 3, which are respectively fed to the terminals 14 and 15, potential values $D_1$ or $D_0$ and $T_1$ or $T_0$ result beneath the doped area D and beneath the transfer gate G3 according to FIG. 2. At the time $t_0$ (FIG. 3) a potential profile $D_0$, $W_1$, P, $T_0$ and $C_0$ exists, whereby the potential value P is provided by the magnitude of the input signal $u_e$. Thereby, the potential well formed beneath the gate G2 is flooded with charge carriers. At the time $t_1$, the potential $D_0$ has changed into the potential $D_1$, whereby the charge carriers again flow back from the area beneath the gates G1 ad G2 into the area D to such an extent that the potential well formed beneath the gate G2 only remains filled to the edge provided by the potential $W_1$, which is indicated by the shaded area F in FIG. 2. If the potential $T_0$ has changed to the potential $T_1$ (at the time $t_2$), the charge F is displaced beneath the electrode 411 in accordance with the broken arrow 17, as the electrode 411 is simultaneously at a relatively high displacement pulse voltage $\phi_1$ which results in a potential value of $C_1$. It is thereby of essence that with a design of the evaluation circuit 81 for a positive evaluation coefficient no amount of charge is read-in when the maximum input signals $u_e$ occur due to $P=P_0$, that the maximum amount of charge is readin when the maximum input signal $u_e$ occurs due to $P=P_1$, the maximum amount of charge which can be illustrated by the area lying between the values of $P_0$ and $P_1$. The read-in process is repeated at the frequency of the pulses $\phi_1$.

If an evaluation circuit, for example, the circuit 8n in FIG. 1, is designed for a negative evaluation coefficient, the input signal $u_e$ is fed to its first input gate by way of the terminal En1 from a parallel input 2n, whereas its second input gate is now connected to a constant DC voltage U2 by way of a terminal En2 and the terminal B2, the voltage being at least as high as the maximum input signal $u_e$ to be evaluated and results in a fixed potential value $W_2$ beneath the gate G2. Beneath the gate G1 then result the potential values $P_1'$ for the maximum input signal and $P_0'$ for the minimum input signal $u_e$. The filling of the potential well beneath the gate G2 is therefore only possible up to the edge defined by the potential P' determined by the input signal $u_e$ applied at the time $t_1$, which is characterized by the area F' in FIG. 2. After the transition of the potential $T_0$ to the potential $T_1$, an of the potential $C_0$ to the potential $C_1$ (at the time $t_2$), the amount of charge F' is again displaced (broken arrow 18) beneath an electrode of the CCD shift register 4. It is of essence that with a negative evaluation coefficient the maximum amount of charge is input when the minimum input signal $u_e$ occurs due to $P'=P_0'$, which is illustrated in FIG. 2 by an area beneath the gate G2 and between the potential values $P_0'$ and $P_1'$, whereas no charge is read-in for the maximum input signal $u_e$ due to $p'=P_1'$. This read-in process is also repeated at the frequency of the pulse voltage $\phi_1$.

Therefore, summation processes occur in the shift register 4 beneath the electrodes 411, 421 etc. with their respective occurrence of the shift pulse voltages $\phi_1$, the summation processes in which the amounts of charge F or F' input by way of the respective parallel inputs are added to the amounts of charge respectively displaced within the shift register 4. The amount of charge increase in this manner by multiple summation processes and finally successively arrive at the last stage of the shift register 4, and then respectively effect potential displacements when penetrating the diffusion zone 9 which was previously brought to the reference potential, the potential displacements being evaluated by way of an amplifier 10 and compounded to the filtered output signal $u_a$.

Figure 4:
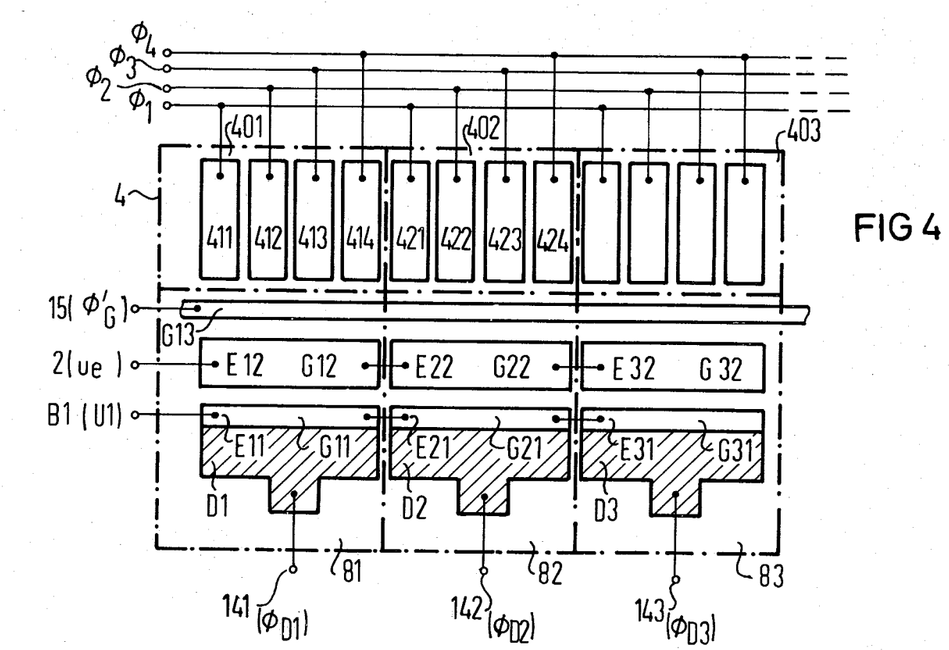
FIG. 4 is a schematic representation of a first exemplary embodiment of the invention.

It is possible to add a constant base charge, which is referred to in the art as a "fat zero", to the amounts of charge displaced by way of the shift register by means of an input stage of the shift register 4 which is known per se and referenced 19 which, for example, is described in the book "Charge Transfer Devices", by Sequin and Tompsett, Academic Press, New York 1975, pp. 48–50, particularly FIG. 3.12 (d). Referring now to a first exemplary embodiment of the invention, as illustrated in FIG. 4, the shift register 4 is designed as a four-phase CCD arrangement. The first stage 401 includes the shift electrodes 411, 412, 413 and 414, while the second stage 402 includes a plurality of electrodes 421, 422, 423 and 424. A third stage of the shift register is refereneced 403, and additional stages and the output stage which can be designed in accordance with the stage AS of FIG. 1 are not illustrated in detail for the purpose of simplicity and clarity. The pulse voltage fed to the first shift electrodes of all stages is referenced $\phi_1$, whereas the shift pulse voltages $\phi_2$, $\phi_3$ and $\phi_4$ are fed to the second, third and fourth electrodes of all stages.

Evaluation circuits 81, 82 and 83 are assigned to the stages 401, 402 and 403. The evaluation circuits respectively include insulated zones D1, D2 and D3 which are oppositely doped relative to the semiconductor substrate, the zones being provided with their own terminals 141, 142 and 143 which are respectively connected to pulse voltages $\phi_{D1}$, $\phi_{D2}$ and $\phi_{D3}$ by way of these terminals. A first input gate electrode of the three evaluation circuits are referenced G11, G21 and G31, and their connections are, in accordance with FIG. 1, referenced E11, E21 and E31. The second input gate electrodes G12, G22 and G32 have terminals E12, E22 and E32. In the embodiment of the invention illustrated in FIG. 4, the first and second input gate electrodes of all evaluation circuits are connected to one another and are provided with common terminals B1 and 2, respectively. A common transfer gate G13 is provided with a terminal 15 for receiving a pulse $\phi_{G'}$. When feeding the input signal $u_e$ to the terminal 2 and applying a constant DC voltage $U_1$, which is not larger than the smallest signal $u_e$, the evaluation circuits 81–83 are respectively designed for a positive evaluation coefficient at the terminal B1. If, however, the input signal $u_e$ is applied to the terminal B1 and a constant DC voltage $U_2$, which is at least as large as the largest input signal $u_e$, is applied to the terminal 2, then only negative evaluation coefficients result. If one wishes to provide a minus sign to the individual evaluation coefficients, for example, to the one of the evaluation circuit 82, the respective inputs of this circuit, in the case considered, thus the inputs E21 and E22, must be connected to the voltages $u_e$ and $U_2$ in the previously described manner as a deviation of FIG. 4.

In FIG. 4, the width of the first input gate electrode and of the second input gate electrode, for example, the gate electrodes G11 and G12, corresponds with the length of the shift register stage 401. It is thereby attained that during the total time interval. $\Delta T$, in which the potential well formed by the shift pulse voltages is located beneath the electrodes of this stage, amounts of charge can be read from the respective evaluation circuit. If the width of the input gate electrodes mentioned is smaller. $\Delta T$ decreases correspondingly. If the width merely corresponds with the length of a CCD electrode, for example the electrode 411, $\Delta T$ is reduced to one-fourth.

Figure 5:
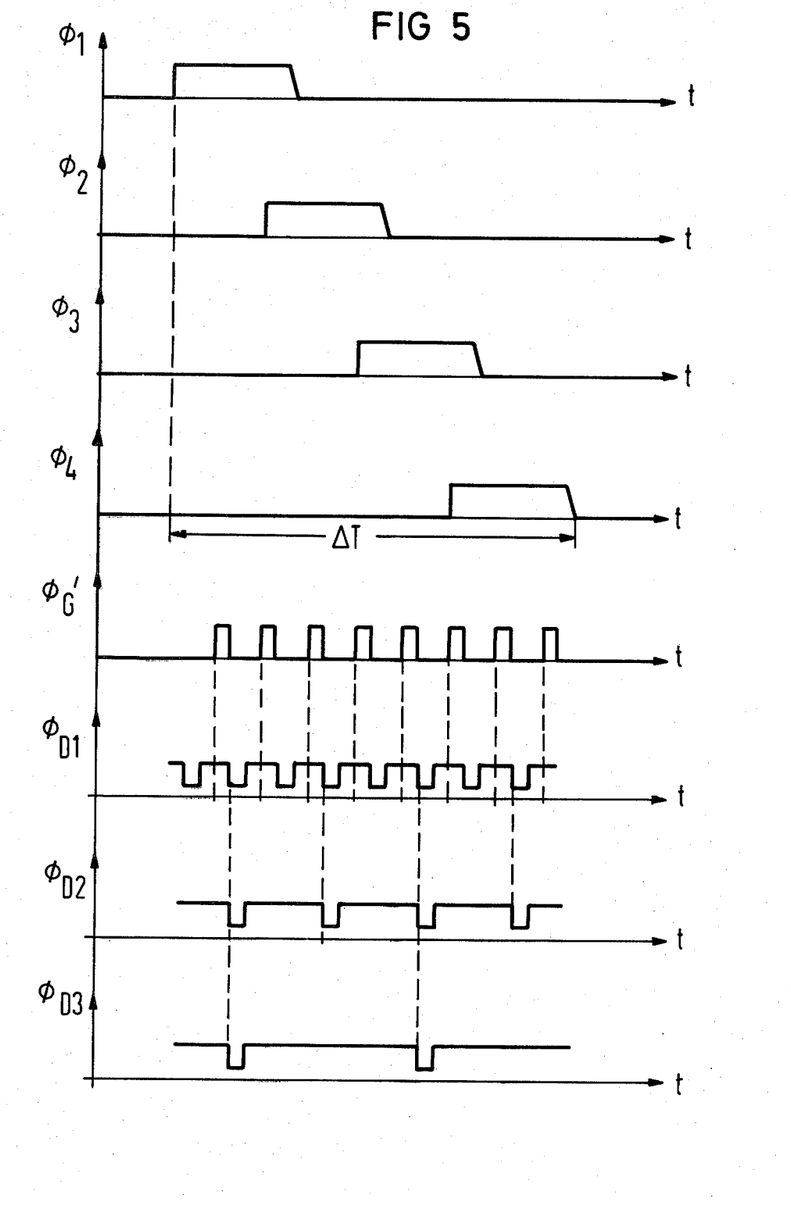
FIG. 5 is a pulse diagram of the operating voltages necessary for the transversal filter illustrated in FIG. 4.

Referring to FIG. 5, the shift pulse voltages of the shift register of FIG. 4 and also the first pulse voltages $\phi_{D1}$, $\phi_{D2}$ and $\phi_{D3}$ and the second pulse voltage $\phi_{G'}$ required for the operation of the circuit of FIG. 4 are illustrated. Within the time interval $\Delta T$, eight pulses of $\phi_{D1}$ occur, four pulses of $\phi_{D2}$ occur and two pulses of $\phi_{D3}$ occur. Thereby, a time delayed occurrence of the pulse $\phi_{G'}$ is assigned to each pulse $\phi_{D1}$. In accordance with FIG. 4, eight amounts of charge determined by the area of the gate G12 are read into the stage 401 within the interval $\Delta T$, four amounts of charge determined by the area of the gate G22 are read into the stage 402, and two amounts of charge determined by the area of the gate 32 are read into the stage 403 so that the evaluation coefficients 81, 82 and 83 relate as 4:2:1. Other repetition rates of the first pulse voltage can also be called upon which do not relate to one another in the ratio of integral numbers. If, however, a common transfer gate G13 is to be provided, the second pulse voltage $\phi_{G'}$ for the pulses of all first pulse voltages which occur chronologically separated must contain an assigned chronologically delayed pulse. If one provides separate transfer gate electrodes for the evaluation circuits, respectively second pulse voltages must be fed to the electrodes, these voltages relating to the first pulse voltages in the ratio set forth above with the aid of the voltage pulse $\phi_{G'}$ and $\phi_{D1}$ in FIG. 5.

Figure 6:
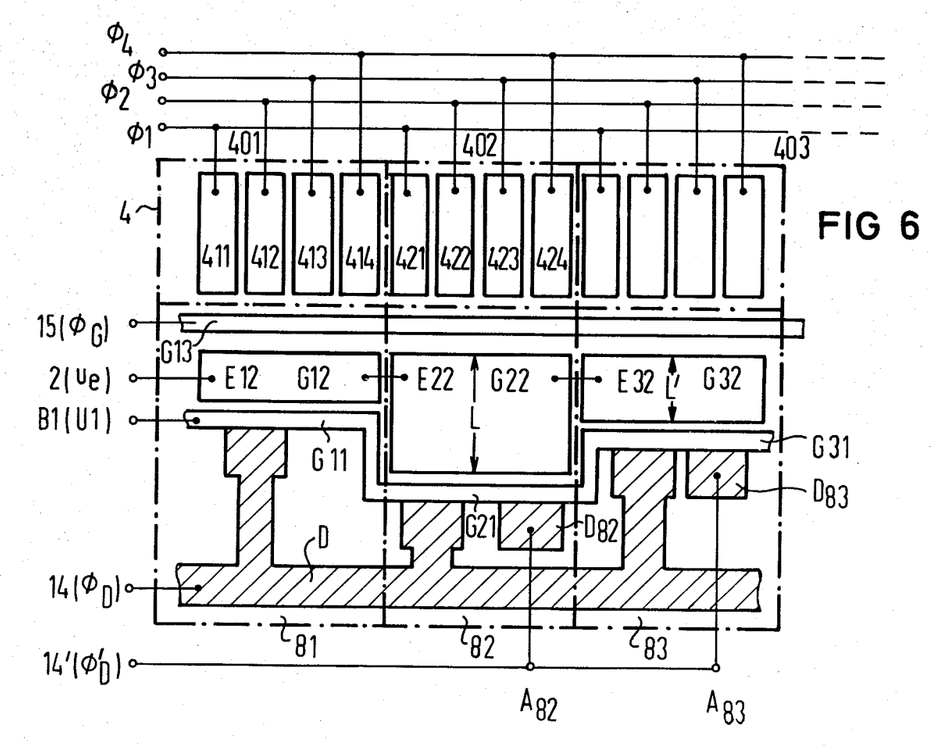
FIG. 6 is a schematic representation of a second exemplary embodiment of the invention.

Referring to FIG. 6, a second exemplary embodiment of a transversal filter constructed in accordance with the invention is schematically illustrated as comprising a plurality of evaluation circuits 81, 82 and 83 respectively assigned to stages 401, 402 and 403, as in FIG. 4, of a CCD shift register. In the embodiment illustrated in FIG. 6, the evaluation circuits include a common area $D_g$ which is doped in opposition to the substrate and which is provided with a terminal 14 for receiving the voltage pulse $\phi_D$. The first input gate electrodes are referenced G11, G21 and G31, while the second input gate electrodes are referenced G12, G22 and G32. In the embodiment illustrated in FIG. 6, the first and second input gate electrodes of the evaluation circuits 81–83 are connected to one another and are provided with common terminals B1 and 2, respectively. A transfer gate G13 is common to all evaluation circuits and is provided with a terminal 15 for receiving a voltage pulse $\phi_G$. When feeding the input signal $u_e$ to the terminal 2 and a constant DC voltage U1, which is not larger than the smallest input signal $u_e$, to the terminal B1, the evaluation circuits 81–83 are designed for a positive evaluation coefficient. If, however, the input signal $u_e$ is connected to the terminal B1 and a constant DC voltage U2, which is at least as large as the largest input signal $u_e$, is connected to the terminal 2, only negative evaluation coefficients result. If one wishes to provide a minus sign to the individual evaluation coefficients, for example, to the evaluation circuit 82, the respective input gate electrodes of the evaluation circuit, in the case considered the electrodes G21 and G22, must be separated from the remaining input gate electrodes as a deviation of FIG. 6 and must be connected to the voltages $u_e$ and U2, whereby the input signal $u_e$ is connected to the electrode G21 and the potential U2 is connected to the electrode G22.

The evaluation circuit 82 includes an additional zone $D_{82}$ doped in opposition to the substrate, which zone is connected with a terminal $A_{82}$. An additional zone $D_{83}$ is also provided in the evaluation circuit 83 and has a terminal $A_{83}$. The terminals $A_{82}$ and $A_{83}$ are connected to a common terminal 14' for receiving a voltage pulse $\phi_{D'}$.

In FIG. 6, the width of the first input gate electrode and of the second input gate electrode, for example the electrodes G11 and G12, corresponds with the length of the assigned stage of the shift register 4, for example, with the length of the stage 401. It is thereby obtained that during the total time interval of $\Delta T$ in which the potential well formed by the shift pulse voltages is located beneath the electrodes of this stage, amounts of charge can be read from the respective evaluation circuit. If the width of the input gate electrodes mentioned is smaller, the interval $\Delta T$ decreases correspondingly. If the width only corresponds with the length of a CCD electrode, for example, with the width of the electrode 411, the interval $\Delta T$ is reduced to approximately one-fourth.

Figure 7:
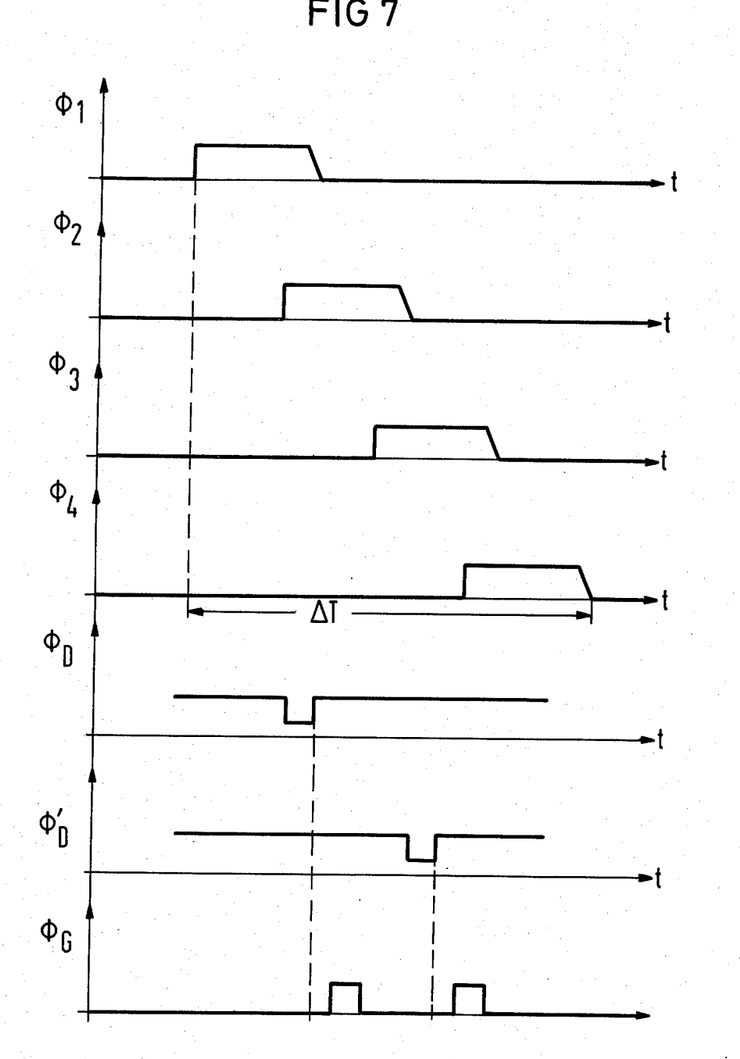
FIG. 7 is a pulse diagram of the operating voltages required for the transversal filter of FIG. 6.

FIG. 7 illustrates the shift pulse voltages $\phi_1-\phi_4$ of the shift register 4 and also illustrates the pulse voltages to be fed to the evaluation circuits 81–83 in their chronological sequence. The latter pulses include a first pulse voltage $\phi_D$ which is fed to the common terminal 14, a second pulse voltage $\phi_G$ which is fed to the terminal 15, and a pulse voltage $\phi_{D'}$ which is derived from the pulse voltage $\phi_D$ by way of a delay element, whereby the delay is selected such that respectively one pulse of each of the voltages $\phi_D$ and $\phi_{D'}$, lie within the time interval $\Delta T$. This means that within the interval $\Delta T$ only one amount of charge determined by the area of the electrode G12 is read into the stage 401, whereas in the same interval two amounts of charge are determined by the electrode G22 and read into the stage 402 and two amounts of charge are determined by the electrode G32 and read into the stage 403.

By the additional actuation of the circuit with the aid of the pulse $\phi_{D'}$ it is possible to double the amounts of evaluation coefficients formed in the circuits 82 and 83 vis-a-vis the values determined by the gate surfaces without additional surface expense. If this doubling were obtained by a corresponding enlargement of the gate surfaces of the electrodes G22 and G32, which would only be possible by an enlargement of the lengths L and L' in the embodiment illustrated in FIG. 6, the read-in processes would also require considerably longer read-in times, which would limit the operating frequency range of the transversal filter.

The second pulse voltage $\phi_G$ applied to the transfer gate G13 in FIG. 6 must have a delayed pulse for each of the chronologically separately occurring pulses of the first pulse voltages $\phi_D$ and $\phi_{D'}$. This is readily obtained in that the pulse $\phi_G$ is derived from the summation voltage of the pulses $\phi_D$ and $\phi_{D'}$ by way of an inverter and a delay element.

Figure 8:
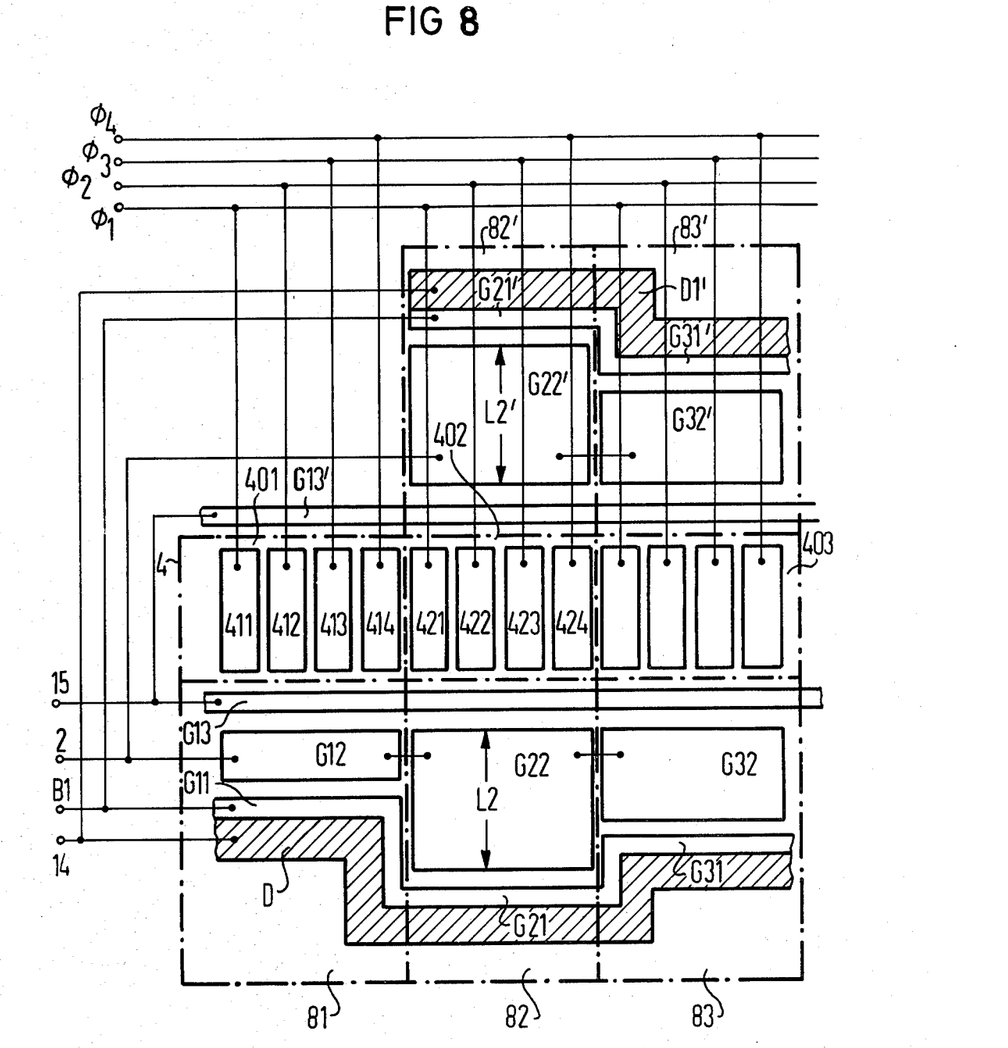
FIG. 8 is a schematic representation of a third exemplary embodiment of the invention.

FIG. 8 illustrates a third exemplary embodiment of the invention in which the evaluation circuits 81, 82 and 83 are again assigned to respective stages 401, 402 and 403 as in FIGS. 4 and 6. The evaluation circuits include a common area D doped in opposition to the substrate, which is provided with a terminal 14. The first input electrodes are referenced G11, G21 and G31, while the second iput gate electrodes are referenced G12, G22 and G32. The first input gate electrodes and the second input gate electrodes of the evaluation circuits 81–83 are connected with one another and are provided with respective common terminals B1 and 2. A transfer gate common to all evaluation circuits is referenced 13 and is provided with a terminal 15. When the input signal $u_e$ is applied to the terminal 2 and a constant DC voltage U1 which is less than the smallest input signal $u_e$ is applied to the terminal B1, the evaluation circuits 81–83 83 are respectively designed for a positive evaluation coefficient. If, however, the input signal $u_e$ is connected to the terminal B1 and a constant DC voltage U2, at least as large as the largest input signal $u_e$, is applied to the terminal 2, only negative evaluation coefficients result. If one wishes to provide a minus sign to individual evaluation coefficients, for example, to the evaluation circuit 82, the respective input gate electrodes of this circuit, in this case the electrodes G21 and G22, must be separated from the remaining input gate electrodes in deviation from that illustrated in FIG. 8 and must be connected to the voltages $u_e$ and U2, whereby the input signal $u_e$ is connected to the electrode G21 and the DC potential U2 is connected to the gate electrode G22.

FIG. 8 provides additional evaluation circuits 82' and 83' which are assigned to the stages 402 and 403 of the shift register 4. The evaluation circuits 82 and 82' and the evaluation circuits 83 and 83' lie respectively symmetrically relative to the center line of the transfer channel of the shift register 4. The evaluation circuits 82' and 83' have a common area D1' doped in opposition to the substrate, which is connected to the terminal 14. The first input gate electrodes G21' and G31' of the evaluation circuits 82' and 83' are connected to the terminal B1, while the second input gate eletrodes G22' and G32' are connected to the terminal 2. Additionally, the evaluation circuits are provided with a common transfer gate referenced G13' which is connected to the terminal 15. Due to the common actuation, the evaluation circuits 82 and 82' or 83 and 83' which lie opposite one another at the respective stages of the CCD shift register are designed for the same sign of the evaluation coefficients. When the input signal $u_e$ is applied at the terminal 2 and the sign is positive for the voltage U1 applied at the terminal B1; it is negative when the input signal $u_e$ is applied at the terminal B1 and the voltage U2 is applied at the terminal 2. If the evaluation coefficients of one of the circuits 81–83, for example the circuit 82 is to receive a minus sign, whereas all remaining stages, for example the evaluation circuits 81 and 83, are designed for positive signs, the first input gate and the second input gate of the circuit lying opposite to the gate, therefore the evaluation circuit 82', must be separated from the input gate electrodes of the evaluation circuit 83' and must be actuated in accordance with the evaluation circuit 82 in the manner already described with respect to the voltages $u_e$ and U2.

Due to the same actuation of the evaluation circuits lying respectively opposite one another, an amount of charge is read into the stage 402 which is proportional to the sum of the surfaces of the input gate electrodes G22 and G22', whereas an amount of charge proportional to the sum of the surfaces G32 and G32' is read into the stage 403. As the input gate electrodes G22 and G22' are dimensioned with the same width, the amount of charge read into the stage 402 corresponds with the sum of the lengths of these electrodes, thus with the sum of L2+L2'. If the evaluation circuit 82' were omitted, the electrode G22 would have to be designed with a length corresponding to the length L2+L2' for reading the same amount of charge into the stage 402. As, however, the read-in time of the amount of charge is approximately proportional to the square of the length of the second input gate electrode, this would mean a considerable increase in read-in time. Therefore, the arrangement of two evaluation circuits lying opposite one another permits reading a prescribed charge amount in a considerably shorter read-in time than would be the case with a single evaluation circuit designed for reading the same amount of charge. If the electrode lengths L and L' are the same, the read-in time is approximately reduced to one-fourth by the measures mentioned above.

Although the shift register 4 was previously only described as a CCD arrangement, it can also consist of any type of arrangements known per se and comprised under the term charge transfer device (CTD), as the same are described, for example, in the book "Charge Transfer Devices" by Sequin and Tompsett, Academic Press, New York, 1975, pp. 1-18. Such a charge transfer device can thereby operate in accordance with its design, for example, in two-phase, three-phase or four-phase operation.

Figure 9:
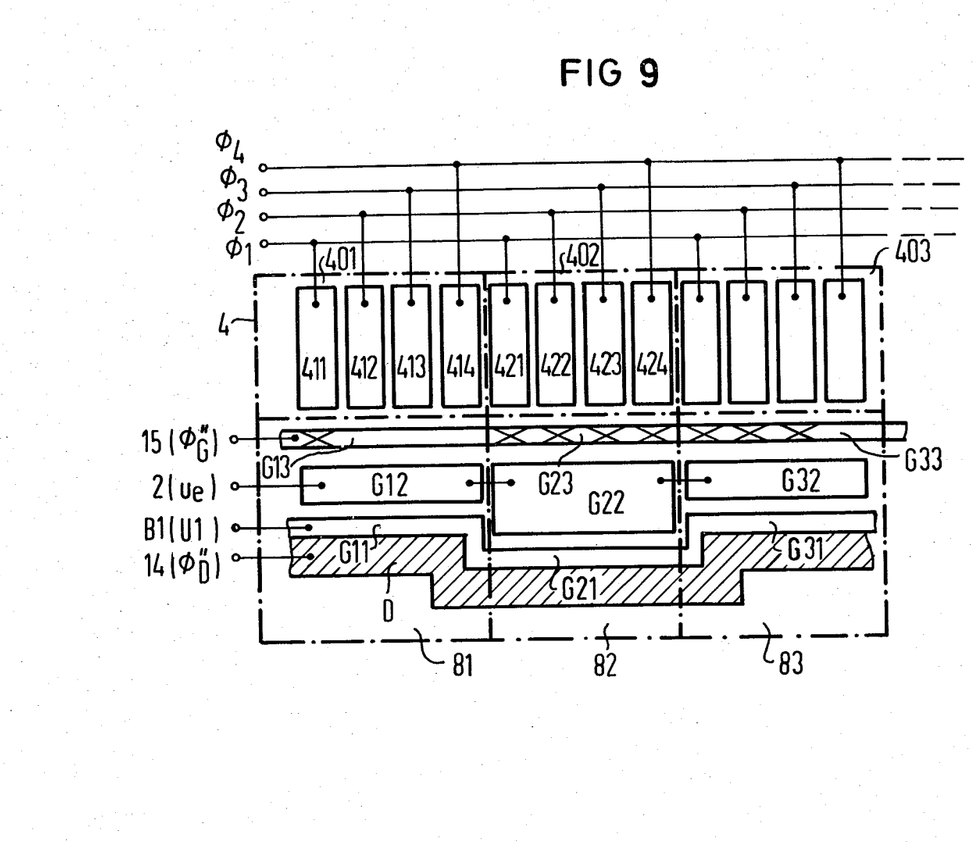
FIG. 9 is a schematic illustration of a fourth exemplary embodiment of the invention.
Figure 10:
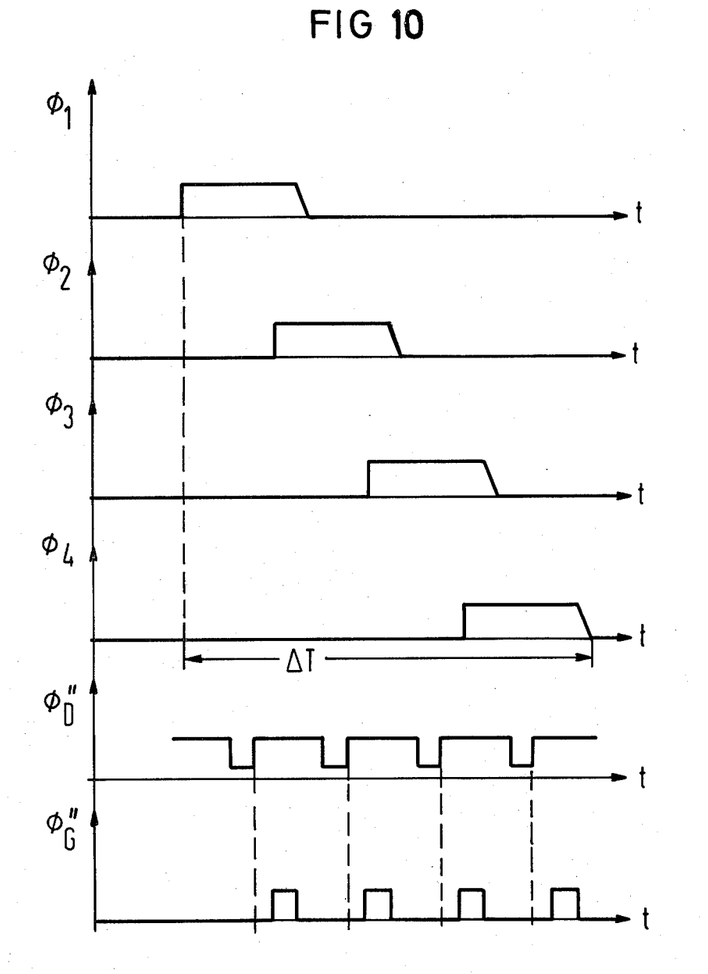
FIG. 10 is a pulse diagram illustrating the operating voltages necessary for the fourth exemplary embodiment of the invention illustrated in FIG. 9.

FIG. 9 illustrates a fourth exemplary embodiment of the invention in which the evaluation circuits 81, 82 and 83 have been assigned to the stages 401, 402 and 403 as in previous cases. Again, the evaluation circuits include a common area D doped in opposition to the substrate, which is provided with a terminal 14. The first input gate electrodes are referenced G11, G21 and G31, while the second input gate electrodes are referenced G12, G22 and G32. In the embodiment illustrated in FIG. 9, the first and second input gate electrodes of the evaluation circuits 81-83 are connected with one another and are provided with respective common terminals B1 and 2. A transfer gate common to all evaluation circuits includes segments assigned to the individual evaluation circuits 81, 82 and 83 and is referenced G13, G23 and G33 which are provided with a terminal 13. When the input signal $u_e$ is applied to the terminal 2 and a constant DC voltage U1 is less than the smallest signal $u_e$ and is connected to a terminal B1, the evaluation circuits 81-83 are respectively designed for a positive evaluation coefficient. If, however, the voltage U2 is connected to the terminal B1 and is at least as large as the largest signal $u_e$ which is connected to the terminal 2, only negative evaluation coefficients result. If one wishes to provide individual evaluation coefficients, with a minus sign, for example with respect to the evaluation circuit 82, the respective input gate electrodes of the circuit, in this case the electrodes G21 and G22, as a deviation from FIG. 9, must be separated from the remaining input gate electrodes and must be connected to the proper voltages $u_e$ and U2, whereby the voltage $u_e$ is connected to the electrode G21 and the voltage U2 is connected to the electrode G22.

In FIG. 9 the width of the first input gate electrode and of the second input gate electrode of an evaluation circuit, for example the electrodes G11 and G12, corresponds with the length of the assigned stage of the shift register 4, for example the length of the stage 401. It is therefore obtained that the evaluation circuit during the total time interval $\Delta T$ in which the potential well formed by the shift pulse voltages is located beneath the electrodes of this stage is prepared for reading amounts of charge. A first pulse voltage $\phi_D$, is applied to the terminal 14 and a second pulse voltage $\phi_G$, (FIG. 5) is applied to the terminal 15, whose pulse repetition rate corresponds with a four-fold pulse repetition rate of a shift pulse voltage $\phi_1-\phi_4$. Thereby, the evaluation circuit considered is prepared in detail such that a charge amount determined by the surface of the second input gate, for example a gate electrode G12, is read-in four times within the time interval $\Delta T$ by means of the area of the second input gate, and at the time when the potential well formed by the shift pulse voltages is located beneath one of the four electrodes of this stage.

In accordance with the invention, measures are taken that of these prepared charge inputs only a very specific number actually results. This is done in that beneath the segment of the transfer gate electrode, for example beneath the electrode G13 assigned to the respective stage of the shift register 4, a thin layer (gate oxide zone) is provided only within a very specific partial segment of the insulating layer which covers the surface of the semiconductor substrate, whereas beneath the remaining portions of the electrode G13 a thick layer (field oxide zone) is present. Beneath the electrode G23 in FIG. 9, thin layer portions are exclusively provided, whereas beneath the electrode G33, three thin layer portions are provided in addition, with respect to the first three electrodes of the stage 403 and a thick layer is provided, in addition, to the fourth electrode. A charge input into the stage 401 thereby results during the time interval $\Delta T$, four charge inputs result into the stage 402 and three charge inputs result into the stage 403. Therefore, for the stage 401 an evaluation coefficient is provided which is proportional to the surface of the electrode G12, for the stage 401 an evaluation coefficient results which is proportional to the quadruple of the surface of the electrode G22, and for the stage 403 a coefficient is provided which corresponds with thrice the surface of the electrode G32.

For a design of the shift register having n electrodes per stage, generally the pulse repetition rate of the first and second pulse voltages $\phi_{D'}$ and $\phi_{G'}$ are selected such that it corresponds with the n multiple value of the pulse repetition rate of one of the shift pulse voltages $\phi_1-\phi_n$, whereby a selection is made by the arrangement of the thin layer portions and of the thick layer portions of the insulating layer beneath the transfer gate electrodes of the individual evaluation circuits, whether the charge amounts determined by the surfaces of the second input gate electrodes are to be read-in in singular, in multiple through a maximum of n multiple, or not at all. The latter is the case when only thick layer portions of the insulating layer are provided beneath the transfer gate of an evaluation circuit.

A transversal filter constructed in accordance with the present invention is advantageously designed as a semi-conductor circuit monolithically integrated on a semi-conductor substrate. Thereby, the surfaces of the second input gate electrodes G12, G22 and G32, for example, can be selected to be the same size in FIG. 4 in order to obtain a particularly simple embodiment. In FIG. 4, on the other hand, components of the circuits supplying the pulse voltages $\phi_{D1}$, $\phi_{D2}$, $\phi_{D3}$ and $\phi_G$, can be included into the integration. In FIG. 6, the electric connection between the terminal 14' and the terminals $A_{82}$ and $A_{83}$ can be designed as a channel-shaped semiconductor area oppositely doped relative to the substrate. The connections of the terminals $A_{82}$ and $A_{83}$ relative to the areas $D_{82}$ and $D_{83}$ can be realized by conductor paths which lie in the plane of the gate electrodes.

If the circuit arrangement in accordance with FIG. 8 is realized as a monolithically integrated semiconductor circuit in a technique having a multilayer metallization, the electrical connections between the individual shift electrodes of the shift register 4 and the feed lines of the shift pulse voltages can be designed as conductor paths which are separated from the connections of the various electrodes of the evaluation circuits having the terminals 2, 14, 15 and B1 by means of an insulating intermediate layer.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A transversal filter comprising:
   a doped semiconductor substrate;
   an analog charge transfer device multistage shift register integrated on said substrate and including a transfer channel, a plurality of inputs and an output, each of said stages including a plurality of shift electrodes for receiving respective repetitive shift pulses; and
   a plurality of evaluation circuits assigned to said shift register inputs and each including
   a zone, separated on said substrate from like zones, and doped opposite to the doping of said substrate,
   a respective electrical terminal for said oppositely doped zone for receiving first pulse voltages at a pulse repetition rate higher than the shift pulse repetition rate,
   a first input gate and a second input gate, one of said input gates connected to receive an input signal and the other input gate connected to receive a constant DC voltage, and
   a transfer gate directly adjacent said transfer channel and an electrical terminal connected thereto for receiving second voltage pulses.

2. The transversal filter of claim 1, wherein each of said second input gates includes an electrode which has a surface area equal to that of like electrodes of each other second input gate.

3. A transversal filter comprising:
   a doped semiconductor substrate;
   an analog charge transfer device multistage shift register integrated on said substrate and including a transfer channel, a plurality of inputs and an output, each of said stages including a plurality of shift electrodes for receiving respective repetitive shift pulses; and
   a plurality of evaluation circuits assigned to said shift register inputs and each including
   a zone common to all evaluation circuits and doped opposite to the doping of said substrate,
   a respective electrical terminal for said oppositely doped zone for receiving first pulse voltages at a pulse repetition rate higher than the shift pulse repetition rate,
   a first input gate and a second input gate, one of said input gates connected to receive an input signal and the other input gate connected to receive a constant DC voltage, and
   a transfer gate directly adjacent said transfer channel and an electrical terminal connected thereto for receiving second voltage pulses,
   at least one of said evaluation circuits including an additional zone doped opposite to said substrate and an electrical terminal connected thereto for receiving additional first pulses which are phase-displaced with respect to said first pulses.

4. The transversal filter of claim 3, comprising:
   an insulated conductor path over said substrate connecting said additional doped zone to said terminal.

5. A transversal filter comprising:
   a doped semiconductor substrate;
   an analog charge transfer device multistage shift register integrated on said substrate and including a transfer channel, a plurality of inputs and an output, each of said stages including a plurality of shift electrodes for receiving respective repetitive shift pulses; and
   a plurality of evaluation circuits assigned to said inputs, each evaluation circuit of at least one pair of said evaluation circuits located on a side of a stage of said shift register opposite the other evaluation circit of the pair, each of said evaluation circuits including
   a zone doped in opposition to said substrate, p1 a common first electrical terminal connected to said doped zones of said pair of evaluation circuits and a respective first electrical terminal connected to the other doped zones for receiving first pulse voltages at a pulse repetition rate higher than the shift pulse repetition rate,
   a first input gate and a second input gate,
   a common second electrical terminal connected to one of said input gates of said pair of evaluation circuits and respective second electrical terminals connected to one input gates of the remaining evaluation circuits for receiving an input signal,
   a common third electrical terminal connected to the other input gates of said pair of evaluation circuits and respective third electrical terminals connected to the other input gates of the remaining evaluation circuits for receiving a constant DC voltage,
   a transfer gate directly adjacent said transfer channel,
   a common fourth electrical terminal connected to said transfer gates of said pair of evaluation circuits and a respective fourth electrical terminal connected to said transfer gates of the remaining evaluation circuit for receiving second voltage pulses.

6. The transversal filter of claim 5, wherein a plurality of pairs of said evaluation circuits are provided with the circuits of each pair disposed on opposite sides of said shift register and including respective common electrical terminals connected to said first input gates, said second input gates, said doped zones and said transfer gates.

7. A transversal filter comprising:
   a doped semiconductor substrate;
   an analog charge transfer device multistage shift register integrated on said substrate and including a transfer channel, a plurality of inputs and an output, each of said stages including a plurality of shift electrodes for receiving respective repetitive shift pulses;
   a plurality of evaluation circuits assigned to said shift register inputs and each including
   a zone doped opposite to said substrate and an electrical terminal connected to said zone for receiving first pulse voltages at a pulse repetition rate higher than the shift pulse repetition rate,
   a first input gate electrode and a second gate electrode, one of said input gate electrodes connected to receive an input signal and the other input gate electrode connected to receive a constant DC voltage, and a transfer gate electrode directly adjacent said transfer channel and an electrical terminal connected to said transfer gate electrode for receiving second voltage pulses; and an insulating layer on said substrate and supporting said transfer gate electrodes, said insulating layer, for each stage of said shift register, including first portions supporting said transfer electrodes adjacent a first predetermined number of said shift electrodes and second, thicker portions supporting said transfer electrodes adjacent a second predetermined number of said shift electrodes and determining the input signal weighting of said evaluation circuits.

8. The transversal filter of claim 7, wherein the widths of said second gate electrodes corresponds to the length of a shift register stage.

* * * * *